United States Patent [19]

Mallick, Jr.

[11] 4,204,425
[45] May 27, 1980

[54] METHOD OF TESTING INDUCTION MOTORS

[75] Inventor: George T. Mallick, Jr., Pittsburgh, Pa.

[73] Assignee: Westinghouse Electric Corp., Pittsburgh, Pa.

[21] Appl. No.: 920,320

[22] Filed: Jun. 29, 1978

[51] Int. Cl.² .............................................. G01L 3/22
[52] U.S. Cl. ..................................... 73/116; 364/481; 324/158 MG; 322/99
[58] Field of Search ............... 364/481, 506, 508, 511, 364/551, 556, 565, 566, 579; 318/798, 799, 805, 490, 308, 309, 311; 324/177, 158 MG, 160, 166, 168; 322/99; 73/116, 136 R, 131, 139, 133 R

[56] References Cited

U.S. PATENT DOCUMENTS

| | | | |
|---|---|---|---|
| 3,052,117 | 9/1962 | Miller et al. | 324/177 |
| 3,402,600 | 9/1968 | Athey | 73/133 R |
| 3,595,073 | 7/1971 | Morris | 73/136 R |
| 3,675,126 | 7/1972 | Chilton | 324/177 |
| 3,789,659 | 2/1974 | Haldeman | 73/134 |
| 3,898,875 | 8/1975 | Knoop et al. | 73/116 |
| 3,942,111 | 3/1976 | Pfouts | 324/158 MG |
| 3,947,764 | 3/1976 | Abbott et al. | 322/99 |
| 4,091,662 | 5/1978 | Emanuel | 324/158 MG |
| 4,100,794 | 7/1978 | Meixner | 73/136 A |

Primary Examiner—Charles E. Atkinson
Assistant Examiner—Gary Chin
Attorney, Agent, or Firm—Robert E. Converse, Jr.

[57] ABSTRACT

A method is provided for testing induction motors, particularly single-phase fractional horsepower motors, which enables routine testing of all motors in production for both starting and running torque and other desired characteristics. The method consists essentially of applying power to the motor for a very short period of time, such as three or four cycles of the supply voltage, then interrupting the power supply and immediately measuring the instantaneous speed by observing the induced voltage from the deenergized motor terminals. The torque then is verified from the change in speed over this short period. Both starting and running torques can be tested very quickly in this manner by means of solid-state control and computing devices, without connecting anything to the motor other than the power leads. Other desired characteristics of the motor can also be readily determined.

19 Claims, 5 Drawing Figures

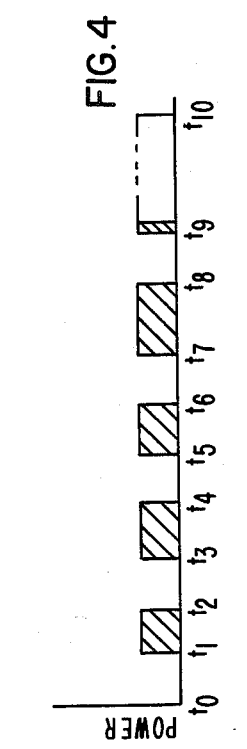
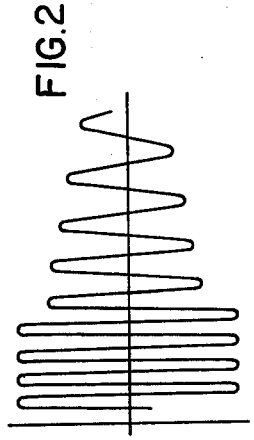
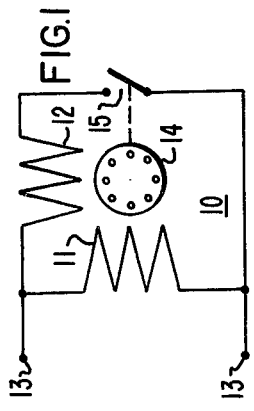
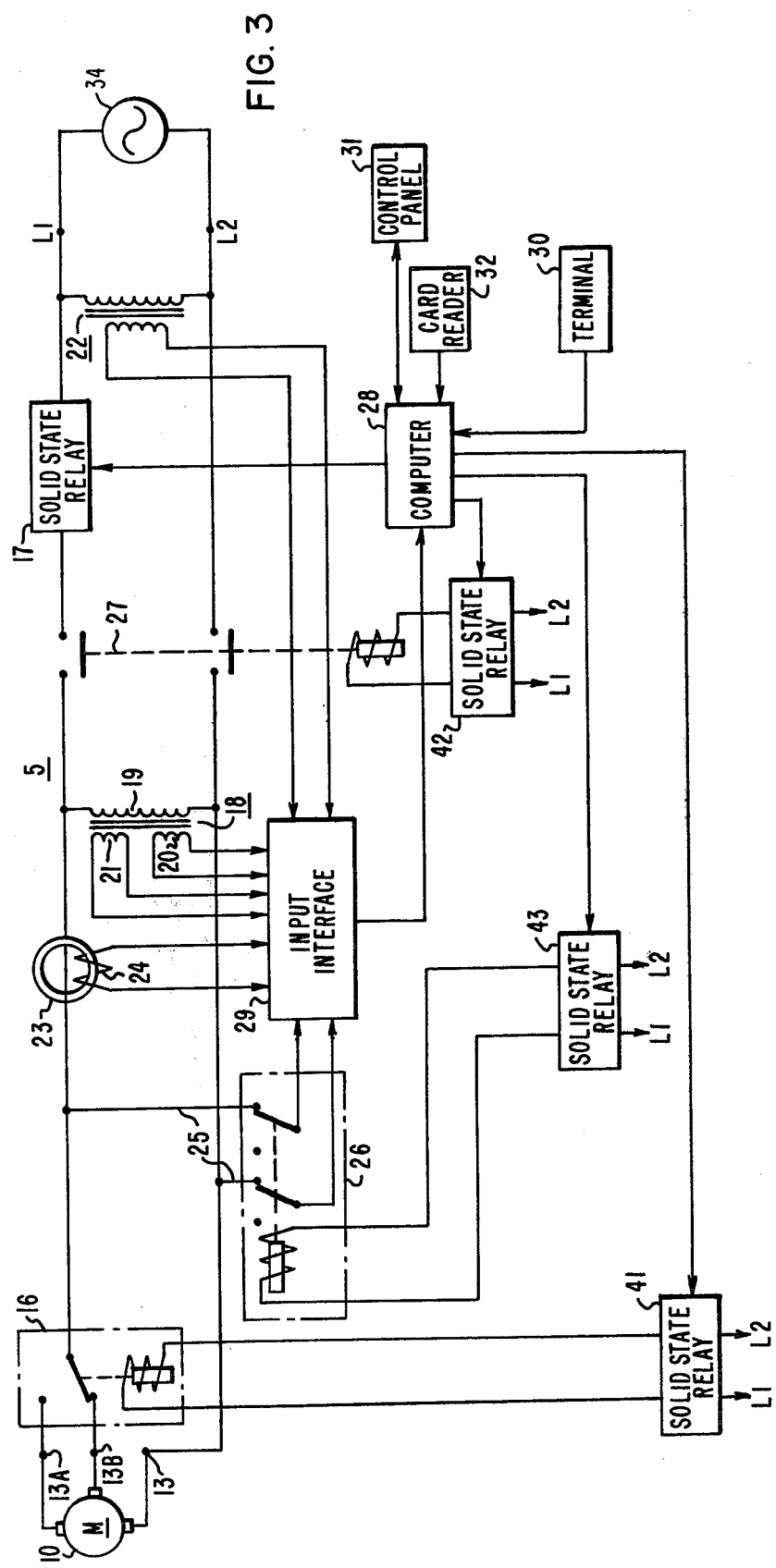

METHOD OF TESTING INDUCTION MOTORS

BACKGROUND OF THE INVENTION

1. Field of the Invention

The present invention relates to the testing of induction motors and, more particularly, to a method for routine inspection of every motor produced.

2. Description of the Prior Art

Single-phase induction motors of fractional horsepower size, such as are used in appliances, are produced in large volume by assembly line methods. Because of this large production volume which, in many cases, may run into thousands of motors per day, it has not heretofore been practical to comprehensively inspect all motors produced; that is, to make tests of all the motor characteristics which it would be desirable to determine. A relatively few simple checks, such as no-load power and current, and insulation integrity, have been made, but these do not directly yield any information concerning motor torque characteristics, friction or bearing losses, and other desirable quantities. Complete tests for quality control purposes have been made heretofore, but on only a relatively few motors selected at random. The great majority of motors produced have thus not been comprehensively tested. Inspection of all motors including tests for torque characteristics and bearing tightness or friction would be highly desirable and would tend to improve the quality and reliability of the end product. This has not heretofore been possible, however, because of the time required and the cost involved in inspection by conventional methods of all motors produced.

SUMMARY OF THE INVENTION

The present invention provides a method for quickly and automatically testing induction motors which makes it possible to more fully inspect all motors in production in minimum time and at low cost.

The new method is particularly suitable for single-phase, fractional horsepower induction motors and other types of motors produced in large volumes, although it is, of course, not limited to these types. The present invention makes possible the rapid, inexpensive, and thorough inspection of every motor produced, by checking more of the important motor characteristics than has previously been possible.

In accordance with the present invention, the motor to be tested is energized by connecting to its line terminals a power supply of the voltage and frequency on which the motor is intended to be used. The motor is energized at zero speed for a very brief time, which may be, for example, three or four cycles of the power supply. The power is then interrupted and the instantaneous speed of the motor determined immediately following interruption of the power supply by measuring the frequency, or period, of the induced voltage in the motor windings. The starting torque of the motor is proportional to this instantaneous speed, which represents the angular acceleration of the motor from standstill to the measured speed. The motor is then again energized for an additional short period of the order of three or four cycles, during which a speed sufficient to open the motor's starting switch should be reached. The power is then interrupted and the instantaneous speed again measured. The running torque is tested from this measurement. The motor may then be accelerated to the normal no-load running speed and the no-load power and current measured. The motor is then deenergized and allowed to coast to a known lower speed, and the time is measured to give an indication of the bearing tightness and, therefore, the bearing friction loss. Other quantities related to torque or to the induced voltage the motor can be determined if desired.

The use of solid-state switching and control devices makes it possible to apply all these tests very rapidly in a preset sequence. Results of the tests on each motor can be determined, and displayed or recorded substantially instantaneously by a minicomputer or microprocessor. The total time required for each motor is of the order of a few seconds, at most. It is thus possible to test all motors on a production line within the short time available for each motor at low cost and in a simple manner, since it is only necessary to connect the power supply to the motor terminals, no other equipment being connected to the motor. A rapid, low-cost method is thus provided for inspection of all motors in production.

BRIEF DESCRIPTION OF THE DRAWINGS

The invention will be more fully understood from the following detailed description, taken in conjunction with the accompanying drawings, in which:

FIG. 1 is a schematic diagram of a typical single-phase induction motor;

FIG. 2 is an oscillogram illustrating the basic operation of the new method;

FIG. 3 is a simplified schematic diagram showing apparatus for carrying out the method;

FIG. 4 is a sequence diagram illustrating the successive steps of a typical testing procedure.

DESCRIPTION OF THE PREFERRED EMBODIMENT

Figure 5:
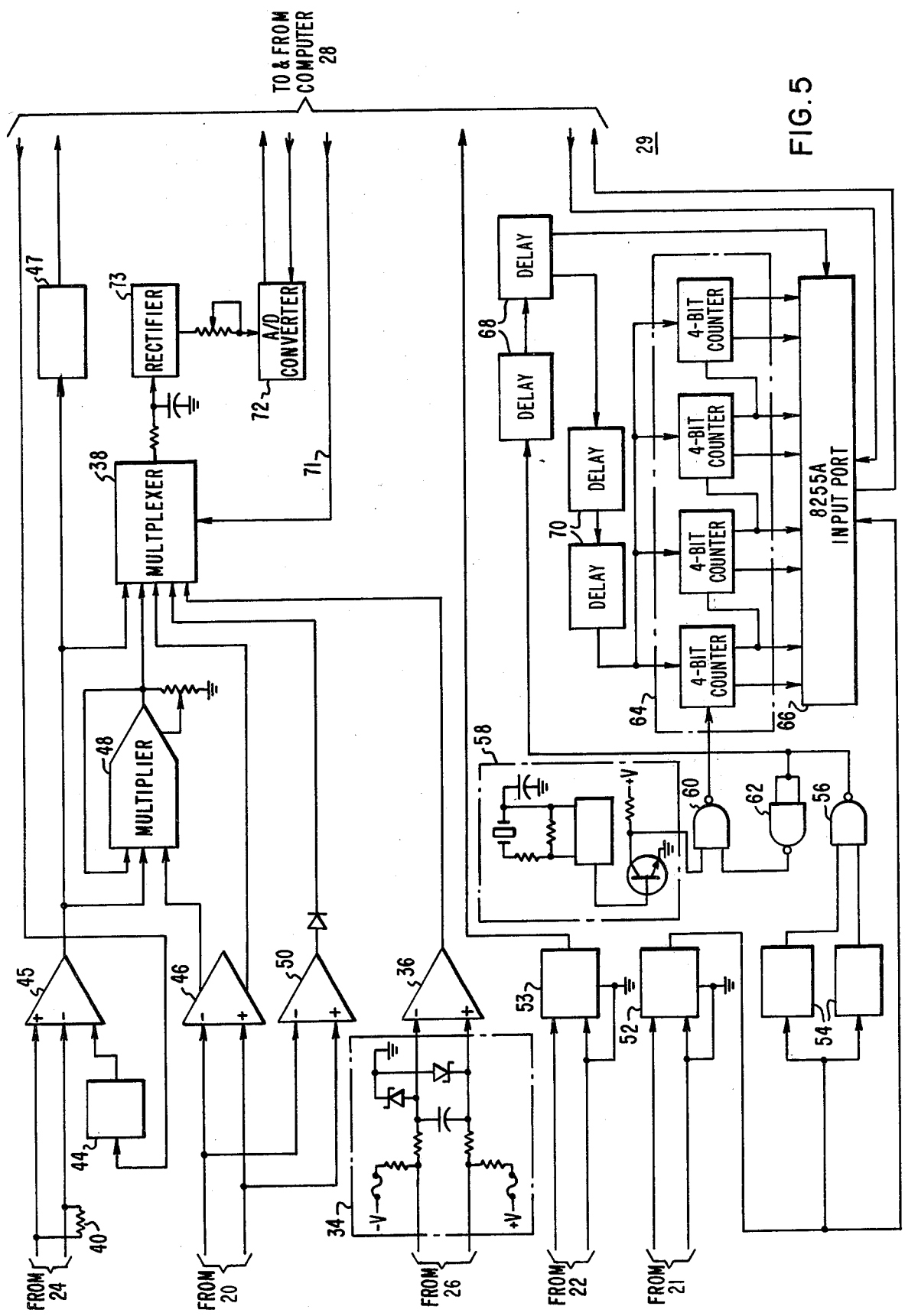
FIG. 5 is a simplified schematic diagram of the computer interface means shown in FIG. 3.

The invention is generally applicable to induction motors of any type but is particularly suitable for single-phase, fractional horsepower motors. FIG. 1 shows a typical motor circuit used in motors of this type. As there shown, the motor 10 has a main or running winding 11 and an auxiliary or starting winding 12. The windings 11 and 12 are connected in parallel to the line terminals 13 of the motor and, as diagrammatically indicated, are physically displaced ninety electrical degrees from each other on the stator of the motor. A rotor 14 is provided, which is shown as a squirrel-cage rotor having a short-circuited winding, and a starting switch 15 is connected in series with the starting winding 12. The switch 15 is a speed-responsive switch, preferably centrifugally operated as indicated by the dotted connection to the rotor, and is closed when the motor is at standstill or low speed. The currents in the windings 11 and 12 are displaced in phase, the phase difference being produced by the use of a high resistance winding for the starting winding or by connecting a capacitor in the starting winding circuit. In either case, the phase displacement results in developing a starting torque when the motor is energized. After the motor has accelerated to the necessary speed the switch 15 opens to disconnect the starting winding 12, allowing the motor to continue to operate on the running winding 11 alone. A second running winding may also be supplied to provide a two-speed motor, the speed of the motor depending on which of the windings is wired to the supply circuit.

Motors of this general type, especially in the fractional horsepower sizes, are produced in very large quantities and it has not heretofore been possible to fully test all motors produced because of the time required and the cost involved using conventional test methods. That is, it would be desirable to test all motors, at least for starting and running torque, and for bearing tightness or friction loss, but because of the time required and the cost involved, it has not been possible to apply these tests to all motors in production. Thus, only a relatively few motors selected at random for quality control purposes have been completely tested.

The present invention provides a new method for testing the torque characteristics, bearing friction and, if desired, other motor characteristics in a very rapid and inexpensive manner making use of solid-state switching and control devices. In general, the new method consists of applying a few cycles of regulated power to the motor, interrupting the power supply, and immediately determining the instantaneous speed of the motor which can readily be done by measuring the frequency, or period, of the induced voltage in the motor windings immediately upon interruption of the power supply. Since the motor torque is proportional to angular acceleration (for a motor having a known moment of inertia), the change in speed during the known time interval represented by the number of cycles of applied power can be utilized to test the average torque over this time period by comparing the angular acceleration of the test motor to a reference value determined from a motor for which an acceptable torque was actually measured. The necessary switching operations and computations can be carried out very rapidly by available solid-state devices, and since no apparatus other than the power supply itself has to be connected to the motor, a rapid and low-cost method of testing all motors in production is provided.

The method is illustrated in the oscillogram of FIG. 2 which shows a typical test applied to a single-phase motor. In this instance, as seen at the left of the oscillogram, four cycles of line voltage were applied to the motor. This was the standard 115 volt, 60 hertz power supply on which the motor was designed to operate. At the end of the four cycles, the power supply was interrupted and the instantaneous speed of rotation measured. The induced voltage in the motor windings after interruption of the power can be seen at the right of the oscillogram as a voltage of decreasing magnitude and frequency as the motor decelerates. The instantaneous speed of the motor at the desired time can then be determined quickly and accurately by measuring the period of the corresponding half-cycle of the induced voltage, such as the third half-cycle. The first half-cycle has been found to be unreliable because of anomalous transient effects.

The torque developed by an induction motor is proportional to the angular acceleration. Therefore, if the motor speed at the time of application of the power supply is known along with the moment of inertia for that motor type, and the speed is measured at the end of the four cycles (or other known time period,) it is possible to calculate the average torque over that time period from the change in speed. For example, if the motor is at standstill when the power supply is applied, then the measured instantaneous speed at the end of four cycles gives the change in speed. The angular acceleration and the starting torque averaged over that time period can then be readily calculated. Similarly, if power is applied at any known speed of the motor, the instantaneous speed measured at the end of the four cycles, or other known time, makes it possible to calculate the change in speed or angular acceleration over that period of time, so that the average running torque can be determined. Other quantities related to the speed or acceleration of the motor can also be determined in this way, such as the rate of induced voltage decay as the motor decelerates. The time required for the motor to decelerate to a given speed after the power is removed can also easily be determined and the bearing tightness or friction loss can thus be measured. Numerous tests can be made in this way and various characteristics of the motor can be determined extremely rapidly and without interruption of production.

An illustrative embodiment of apparatus 5 for performing these tests is shown in simplified form in FIG. 3. A two-speed motor 10 has its input terminals connected to a power supply represented by terminals L1, L2. The motor terminals include a common terminal 13, a first running winding terminal 13A and a second running winding terminal 13B for high speed operation. A solenoid operating switch 16 is selectively energized to connect the power supply line L1 to either of the two running winding terminals 13A or 13B to select the desired running speed. The terminals L1 and L2 may be permanently energized from a regulated power source of any type, preferably of the voltage and frequency for which the motor 10 is designed. The terminals L1 and L2 could also be selectively connected, by apparatus not shown, to any of a plurality of power supplies. This would provide flexibility to test a variety of motors designed to operate upon different power sources. The terminals 13, 13A, and 13B are the normal line terminals of the motor and may be connected to the power supply leads L1 and L2 by any suitable quick-connect device such as sliding contacts on a conveyor belt.

A solid-state relay or switching device 17 is connected in series between the power supply terminal L1 and the motor terminals 13A and 13B. Such devices are readily available which are capable of essentially instantaneous switching of motor load currents. A potential transformer 18 having two secondary windings 20 and 21 is connected with its primary winding 19 across the power lines L1 and L2. A second potential transformer 22 is also connected across the power supply lines L1 and L2 on the supply side of the solid-state relay 17.

A current transformer 23 is positioned such that the power supply lead L1 functions as its primary winding. A secondary or sensing winding 24 provides an output current proportional to current flow through the power supply lead L1. Resistance sensing leads 25 are also connected across the leads L1 and L2 between the solenoid-operated switch 16 and the current transformer 23. The leads 25 are connected through a second solenoid-operated switch 26 to input interface means 29. A contactor 27 has its terminals connected in series with the power supply leads L1 and L2 to provide a disconnect function to be more completely described below.

A computer 28 provides the control and calculating function of the apparatus 5, based on input data supplied through the input interface means 29. The DC resistance leads 25, current transformer sensing winding 24, potential transformer secondary windings 20 and 21, and the secondary winding of potential transformer 22 are all connected to the input interface means 29. The computer 28 provides output signals to control solid-state relays 17, 41, 42 and 43. The relay 41 energizes the switch 16, the relay 42 energizes the contactor 27, and the relay 43 energizes the switch 26.

The computer 28 may be any type of data processing and signaling device, such as a minicomputer or microprocessor, which is capable of being programmed to control the relays 17, 41, 42 and 43 in the desired sequence and to process the input signals into useful data. It has been found that the system 80/20 microprocessor system obtainable from the Intel Corporation is suitable.

A control panel 31 and card reader 32 are connected to the computer 28 to allow operating personnel to supply commands and data to the computer to have the desired testing sequence performed and to display data. A terminal unit 30 may also be supplied to store on a bulk basis statistical data accumulated by the computer 28 and to print out hard copy reports.

Referring now to FIG. 5 the input interface means 29 are shown in more complete detail. As can be seen, the DC resistance leads 25 are selectively connected or disconnected under the influence of the solenoid-operated normally closed switch 26 to a fuse-protected resistance measuring power supply 34. With the switch 26 in the closed circuit position, a regulated voltage is supplied to the leads 25 and through the windings of the motor 10. A signal proportional to the DC resistance of the windings of the motor 10 is thus supplied to the input terminals of an amplifier 36, the output of which is connected to one input of a multiplexer device 38, such as the type AD7501 available from the Analog Devices Corporation.

The sensing winding 24 of the current transformer 23 is connected across a shunt resistor 40 to produce a signal proportional to the current flow through the power supply lead L1. This signal is applied to the input of an amplifier 45, the output of which is connected to another input terminal of the multiplexer device 38.

Since the apparatus 5 is used to test a wide range of motors, the amount of current flowing in the line L1 can vary considerably. Therefore, a device 44 is provided to vary the gain of the amplifier 45 under control of the computer 28. The device 44 is available in commercial quantities from the Analog Devices Corporation as the type AD7501.

The secondary winding 20 of the transformer 18 is connected to the input of amplifier 46, the output of which is supplied both to a third input of multiplexer device 38 and to one input of a multiplier device 48, such as a type AD435 available from the Analog Devices Corporation. Another input of the multiplier device 48 is connected to the output of amplifier 45 which represents the current flow through the power supply line L1. The output of the multiplier device 48 is thus a signal representative of the power being supplied to the motor 10. This output is also connected to the multiplexer device 38.

The secondary winding 20 of the transformer 18 is also connected through an amplifier 50 having a higher gain than the amplifier 46. This output is supplied to the multiplexer 38 to be used by the computer to determine the proper time in the alternating current cycle to switch the solid-state relays.

The secondary winding 21 of the transformer 18 is supplied to the inputs of a comparator 52, one of which is grounded. Thus, the output of the comparator 52 is a square wave which transitions at every zero crossing of the output voltage of secondary winding 21.

The square wave output from the comparator 52, used to determine motor speed, is applied to the inputs of identical one shot multivibrator devices 54. The devices 54 are connected so as to provide a 20 microsecond pulse on alternate transitions of the square wave from the comparator 52. These pulses are applied to the inputs of a gate 56 to produce a 20-microsecond pulse on every transition of the square wave.

A crystal oscillator 58 produces a train of 100 kHz pulses which are supplied to one input of a gate 60, the other input of which receives the 20 microsecond pulses after conditioning by a gate 62. Thus, the input of the gate 60 is a train of 100 kHz pulses which are interrupted during the duration of the 20-microsecond pulse. The 100 kHz pulse train is supplied to a counter 64 which may be, for example, composed of four type 7493 four-bit counter devices. The counter 64 is, in turn, connected to an input port 66 of the computer 28. The input port may be, for example, a type 8255 device.

The 20-microsecond pulses from the output of the gate 56 are also supplied to a pair of series-connected delay devices 68 which may be, for example, type 74123 devices. The output of the second delay device 68 is a 20-microsecond pulse which is delayed from the output pulses of the gate 56 by approximately 15 microseconds. These delay pulses are applied to the port 66 to form strobe pulses which command the port 66 to read the output of the counter 64. The delayed 20-microsecond pulse output of the devices 68 is applied to a further pair of delay devices 70 to form reset pulses for the counter 64. These reset pulses are delayed from the 20-microsecond pulses supplied at the output of the gate 56 by a period of approximately 30 microseconds.

The various inputs of the multiplexer device 38 are selected by means of control leads 71 from the computer 28, and after rectification by the device 73 are presented on a one-at-a-time basis to the input of an analog-to-digital converter 72. The selected multiplexer input signal is converted by the device 72 and supplied in the appropriate digital format to the computer 28.

The signal from the transformer 22 is applied to the inputs of a comparator 53, one of which is grounded. The output of comparator 53 is thus a square wave similar to the output of comparator 52, and is supplied to the computer 28 to provide phase information about the power leads L1, L2 to allow the computer 28 to energize the solid state relays at the proper point in the AC power cycle.

In operation, the motor 10 is momentarily energized and allowed to coast. The windings of the motor 10 thus produce a back EMF which is sensed by the winding 21 of the transformer 18. The AC output of the winding 21 is converted to a square wave by the comparator 52 and a gated 100 kHz pulse train is applied to the input of the counter 64. At the first transition of the square wave (corresponding to the next zero crossing of the AC output signal of the winding 20) the 100 kHz pulse train to the counter 64 is interrupted. A strobe pulse is applied from the output of the devices 68 to cause the input port 66 to read the output of the counter 64. Shortly thereafter, the reset pulse from the devices 70 arrives to reset the counter 64. The pulse count accumulated between successive zero crossings of the output signal of the winding 20 is processed by the computer 28 to determine the speed of the motor 10.

The solenoid-actuated switch 26 insures that line voltage will not be impressed across the terminals 30 of the input interface 29 when the sensitive resistance measurement is being made. In a similar manner, the contactor 27 provides isolation so that leakage through the solid-state relay 17 and transformer 18 will not affect the accuracy of current or voltage measurements.

A typical test sequence for the motor 10 is shown in FIG. 4 which represents a series of successive time intervals, the periods during which power is applied to the motor being shaded. The motor is initially connected to the test circuit at the time $t_0$ with the relay OFF so that the motor is not immediately energized, the contactor 27 open, and the switch 26 closed. During the time interval from $t_0$ to $t_1$, static measurements may be made, if desired, including, for example, the measurement of winding resistance of either or both windings. With the motor deenergized and at standstill, or zero speed, the relay 17 is then turned ON at time $t_1$ to apply power to the motor and is turned OFF at time $t_2$ to interrupt the supply of power. It is to be noted that in all cases, the contactor 27 is closed and the switch 26 opened prior to energizing of the motor by the relay 17, and the contactor 27 opened and switch 26 closed after deenergization of the motor by the relay 17. The time interval between $t_1$ and $t_2$ is a predetermined very short period, preferably either three or four cycles of the line voltage applied at the terminals 13, 13a/13b. The number of cycles, or the exact duration of the time period is not critical except that it should be short enough so that the switch 15 does not open, and it must, of course, be accurately determined. This time will be referred to as a small number of cycles which is to be understood as meaning a time period which is preferably of the order of three or four cycles of the applied voltage, although not limited to this exact time. At the time $t_2$, computer 28 deenergizes the motor by turning OFF the relay 17, and the period of the voltage appearing at the motor terminals 13, 13a or 13b is immediately determined by means of the potential transformer winding 20. The speed of the motor is calculated by the computer 28 from this period. As previously explained, the torque of an induction motor is proportional to the angular acceleration for a motor having a given moment of inertia, and since the motor started at zero speed, at time $t_1$, the instantaneous speed at time $t_2$ represents the angular acceleration of the motor, that is, the change in speed over the time $t_1$ to $t_2$. The torque determined from this change in speed, therefore, represents the motor starting torque averaged over the time period from $t_1$ to $t_2$. In the case of a 60 Hz four-pole motor with no load, for example, the speed will reach about 400 RPM in this time, which will give an average value of starting torque sufficiently representative to indicate whether the motor meets the predetermined requirements.

Following determination of the starting torque, the motor is again energized by turning ON relay 17 at the time $t_3$ to reapply power. The current drawn by the motor is monitored by the computer 28 to detect a sudden drop in the current which indicates that the starting switch 15 has opened. The motor is deenergized at this point, which is time $t_4$ in FIG. 4. Between times $t_4$ and $t_5$, the motor remains deenergized and coasts down to a lower speed which, in the example mentioned, may be about 800 RPM but which, in general, may be any predetermined known speed in the range in which the starting switch 15 remains open. At this speed, the motor is reenergized, at time $t_5$, for a small number of cycles until time $t_6$ when it is deenergized. The instantaneous speed is determined immediately following interruption of the power supply by measuring the period of the induced voltage as before. The difference in speed between times $t_5$ and $t_6$, therefore, represents the angular acceleration over that time period, and the running torque averaged over that period is thus determined.

Following determination of the running torque, the motor is again energized, a time $t_7$, and allowed to accelerate until the full no-load speed of the motor is reached. The no-load power and current are then directly measured just prior to deenergization at time $t_8$. If desired, an overvoltage test may also be applied by subjecting the motor to a substantial overvoltage for a brief time, of the order of six to eight cycles, and monitoring the current and voltage for any indication of shorted turns in the winding. At time $t_9$, the motor is briefly energized, if necessary, to return it to full no-load speed, and is then deenergized. The time required for the motor to decelerate to a preset speed is then measured at $t_{10}$. This coasting time, of course, depends on the tightness of the bearings, which indicates friction loss, and the mechanical condition of the motor bearing. The rotor time constant may also be determined, if desired, immediately upon deenergization of the motor at the beginning of the coasting period. This is done by measuring the rate of decay of the induced voltage in the motor windings. The rotor time constant thus determined is important since it reflects the integrity of the rotor winding and the magnetic properties of the rotor. The motor is then allowed to coast down and the centrifugal switch closing speed determined by noting the change in motor winding resistance. The test sequence is then complete and the motor can be removed from the test circuit.

It will be noted that this entire sequence of testing can be completed in a total time of not more than a few seconds, plus the coasting time, so that it can readily be applied to all motors in production as they reach the end of the production line. The desired motor characteristics, including at least the starting and running torques, power and current requirements, and the bearing condition, are thus determined for all motors. The operation is very simple as it is only necessary to connect the terminals 13, 13a or 13b of the motor to the test circuit and no other equipment has to be connected to the motor. The control panel 31 may be of any suitable type, and of any desired level of sophistication, to display the values of the test quantities visually and to select the data desired to be displayed. For routine production testing, the control panel might simply actuate a visual or audible alarm signal to indicate that the particular motor being tested is outside of preset limits in one or more of the characteristics measured.

It will now be apparent that a method and apparatus for testing induction motors has been provided which makes it possible to inspect all motors in production by giving them a complete set of tests in a matter of a few seconds without delaying the production line and at a relatively low cost. A particular set of tests and a suitable test sequence have been described in detail for the purpose of illustration, but it will be apparent that the test sequence can be varied as desired and that other tests could be included and other characteristics of the motor could also be determined.

What is claimed is:

1. A method of testing an induction motor which comprises providing an alternating current power supply of the voltage and frequency on which the motor is intended to operate, applying said power supply to the motor is an unloaded condition at a known speed of rotation of the motor, interrupting the power supply after a first predetermined time period before the motor has reached running speed, immediately measuring the instantaneous speed of rotation of the motor, and determining the motor torque using the change in speed.

2. A method of testing as defined in claim 1 in which said power supply is initially applied to a motor having a running winding and a switch-operated starting winding at zero speed to test the starting torque, and including the further steps of reapplying the power supply with the motor in an unloaded condition at a known higher speed of the motor at which the starting winding has been disconnected, interrupting the power supply after a second predetermined time period, immediately measuring the instantaneous speed of the motor, and determining the running torque of the motor using the increase in speed produced by the second predetermined time period of power application.

3. A method of testing as defined in claim 1 in which said power supply is initially applied to the motor in an unloaded condition at zero speed to test the starting torque, and including the further steps of accelerating the motor to a higher speed after the first-mentioned test, allowing the motor to coast to a predetermined known speed, reapplying the power supply, interrupting the power supply after a second predetermined time period before the motor has reached full running speed, immediately measuring the instantaneous speed of the motor, and determining the running torque of the motor using the increase in speed produced by the second predetermined time period of power application.

4. A method of testing as defined in claim 1 in which the instantaneous speed of the motor is determined by measuring the period of the induced voltage in the motor windings immediately after interruption of the power supply.

5. A method of testing as defined in claim 4 wherein the period of the induced voltage in the motor windings is measured by sensing the zero-crossing times of said induced voltage and measuring the time between successive zero crossings.

6. A method of testing as defined in claim 5 wherein the time between successive zero crossings of the induced motor voltage is determined by gating a pulse train of known frequency into a counter for a time period equal to the time between successive zero crossings of the induced voltage and reading the pulse count accumulated by said counter over said time period.

7. A method of testing a single-phase induction motor having starting and running windings and a speed-responsive starting switch in series with the starting winding, said method comprising providing an alternating current power supply of the voltage and frequency on which the motor is intended to operate, applying said power supply to the motor terminals with the motor in an unloaded condition at zero speed, interrupting the power supply after a predetermined time period, immediately measuring the instantaneous speed of rotation of the motor, and testing the starting torque of the motor by comparing the measured speed to a reference speed.

8. The method of testing defined in claim 7 and including the further steps of accelerating the motor to a speed above the opening speed of said starting switch, reapplying said power supply to the motor terminals with the motor in an unloaded condition at a known speed in the range where said switch is open, interrupting the power supply after a second predetermined time period, immediately measuring the instantaneous speed of the motor, and testing the running torque using the change in speed produced by the second predetermined period of power supply application.

9. The method of testing defined in claim 8 in which said instantaneous speeds of the motor are measured by determining the period of the induced voltage appearing at the motor power terminals immediately after interruption of the power supply.

10. The method of testing defined in claim 8 and including the further step of energizing the motor to bring it to its normal no-load speed and measuring the motor current and power.

11. The method of testing defined in claim 10 and including the further step of deenergizing the motor and measuring the time to coast to a predetermined speed.

12. The method of testing defined in claim 10 and including the further step of deenergizing the motor and immediately determining the rate of decay of the induced voltage in the motor winding.

13. The method of testing defined in claim 7 and including the further steps of reenergizing the motor to accelerate it to a higher speed, observing the motor current to determine the point at which said starting switch opens, thereafter allowing the motor to coast to a predetermined speed at which the starting switch remains open, reapplying the power supply at said predetermined speed, interrupting the power supply after a predetermined time period, immediately measuring the instantaneous speed of the motor, and testing the running torque from the change in speed.

14. Apparatus for testing an induction motor comprising:
means for momentarily energizing a motor from a power supply;
means for sensing the back electromotive force induced in the motor windings after said momentary energization;
means connected to said sensing means for determining the period of revolution of the motor;
computer means connected to said energizing means and said period determining means for initiating and terminating the energization of the motor, said computer means also calculating motor performance parameters and comparing said performance parameters to predetermined limit values; and
means connected to said computer for indicating the detection of performance parameters out of limits.

15. Apparatus as recited in claim 14, wherein said energizing means comprises a solid state relay.

16. Apparatus as recited in claim 15 comprising means for isolating said sensing means from said solid state relay.

17. Apparatus as recited in claim 14 wherein said period determining means comprises a zero crossing detector, an oscillator gated by output of said zero crossing detector, and a counter for accumulating pulses of said oscillator between successive zero crossings of said back electromotive force.

18. Apparatus for testing an induction motor, comprising:
means for rapidly connecting and disconnecting a motor and a power supply;
means for measuring the instantaneous speed of the motor immediately following disconnection;
means for controlling said connecting means to energize the motor for a predetermined time period on the order of a small fraction of a second, said control means also determining motor performance parameters from said instantaneous speed measurements and from said predetermined time period, said control means also comparing said performance parameters against predetermined limit values; and means connected to said control means for initiating corrective action whenever said measured performance parameters fall outside said predetermined limit values.

19. Apparatus as recited in claim 18 wherein said controlling and connecting means are operable to energize the motor for a predetermined time period of about 0.25 seconds or less.

* * * * *